(12) United States Patent
Jacobsen et al.

(10) Patent No.: US 8,288,243 B2
(45) Date of Patent: Oct. 16, 2012

(54) METHOD FOR FABRICATING THROUGH SUBSTRATE MICROCHANNELS

(75) Inventors: Stuart McDougall Jacobsen, Frisco, TX (US); Byron Neville Burgess, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 209 days.

(21) Appl. No.: 12/761,085

(22) Filed: Apr. 15, 2010

(65) Prior Publication Data
US 2011/0256687 A1    Oct. 20, 2011

(51) Int. Cl.
*H01L 21/76* (2006.01)
(52) U.S. Cl. .. 438/424; 438/427; 438/430; 257/E21.546
(58) Field of Classification Search ............... 438/400, 438/421, 422, 424, 427, 430; 257/E21.546
See application file for complete search history.

(56) References Cited

U.S. PATENT DOCUMENTS

| | | | |
|---|---|---|---|
| 5,006,202 A * | 4/1991 | Hawkins et al. | 216/27 |
| 6,475,402 B2 * | 11/2002 | Nordstrom et al. | 216/27 |
| 2004/0185323 A1 * | 9/2004 | Fowler et al. | 429/38 |
| 2007/0042563 A1 * | 2/2007 | Wang et al. | 438/424 |
| 2007/0079509 A1 * | 4/2007 | Silverbrook | 29/890.142 |

* cited by examiner

*Primary Examiner* — Leonard Chang
(74) *Attorney, Agent, or Firm* — Jacqueline J. Garner; Wade J. Brady, III; Frederick J. Telecky, Jr.

(57) ABSTRACT

A method of forming large microchannels in an integrated circuit by etching an enclosed trench into the substrate and later thinning the backside to expose the bottom of the trenches and to remove the material enclosed by the trench to form the large microchannels. A method of simultaneously forming large and small microchannels. A method of forming structures on the backside of the substrate around a microchannel to mate with another device.

12 Claims, 14 Drawing Sheets

METHOD FOR FABRICATING THROUGH SUBSTRATE MICROCHANNELS

FIELD OF THE INVENTION

This invention relates to the field of integrated circuits. More particularly, this invention relates to creating microchannels through integrated circuit wafers.

BACKGROUND OF THE INVENTION

Circuits are being integrated more and more into chemical analysis systems. For these applications there is a need to deliver liquids from external sources into integrated silicon microcircuit sensors. Such a microcircuit may combine electrical components, sensor components and liquid channels to deliver fluids to specific sensors either for testing and electronic recording or to eject samples into a microanalysis plate. Sometimes it is desirable for tens, hundreds, or even thousands of different liquid formulations to be delivered into such a microcircuit. Applications may include for example, microanalysis of chemicals, analysis of body fluids, sequencing of DNA and nucleotides and other medical applications.

In addition, as integrated circuits continue to scale circuit density and power density increases. This necessitates the development of ways to efficiently remove heat from integrated circuits. One such way is to build micro channels into the integrated circuit through which coolant may be pumped.

When stacking multiple chips in a multichip module it may be desirable to run signals from an upper chip to a lower chip. Large through silicon vias may be formed to provide channels through which to run wires from an upper chip to a lower chip.

One method of forming microchannels is to use laser drilling which limits the number of microchannels that may be formed because they are drilled one at a time. A second method is to use deep reactive ion etching (DRIE) which may be very time intensive especially if large diameter microchannels are to be formed. A third method is to use wet etching with an etchant such as tetramethylammoniumhydroxide (TMAH) for example, which typically forms microchannels with highly sloped (about 55% slope) sidewalls due to accelerated etching along silicon crystal planes. A fourth method is to use grit blasting which is not as precise and is not as clean as the methods previously mentioned. With some of the above mentioned methods, simultaneously forming microchannels with different sizes may be problematic because of differences in etch rates vs microchannel size.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

Deep holes or trenches are etched into a semiconductor substrate wafer either before or after isolation, but prior to building the integrated circuit. By forming trenches that enclose various areas of substrate, differently sized microchannels may be formed without significantly changing etch loading effects. These holes or trenches are filled with a material which can withstand the processing temperatures and conditions used to build transistors and is later removed to form a microchannel. After the integrated circuit processing is complete, the backside of the wafer thinned to expose the bottom of the holes or trenches and the material is removed to form the microchannels. In the case of large microchannels when the material is removed from a trench which encloses a portion of the substrate, the enclosed portion of the substrate is also removed to form a large microchannel opening. If desired, additional processing may be performed on the backside of the wafer prior to removal of the material from the trenches to build structures suitable for mating with a fluid delivery system or for mating with some other device.

DETAILED DESCRIPTION

Figure 1A:
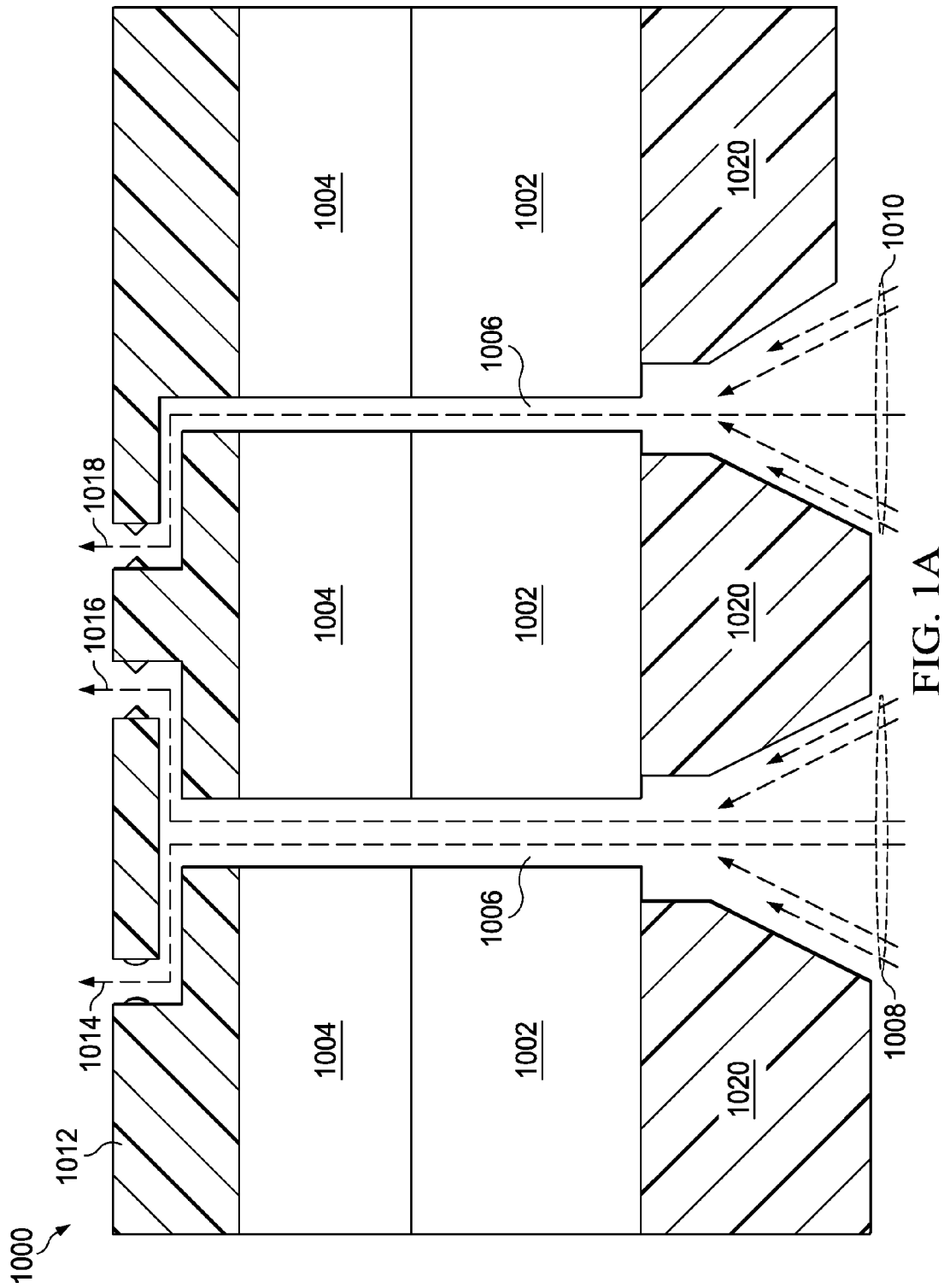
FIGS. 1A and 1B are crossections of integrated circuits with through silicon microchannels.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit (1004) with through substrate microchannels (1006) that are coupled to sensors (1014), (1016), and (1018) is shown in FIG. 1A (1000). Microchannels (1006) are formed through substrate (1002) before the integrated circuit (1004) is fabricated. Sensors (1014), 1016) and (1018) may be fabricated as part of the integrated circuit or may be later attached to the integrated circuit. A fluid or gas delivery system (1020) may also be attached to the substrate (1002) to deliver fluids or gases (1008) and (1010) through the microchannels (1006) to the sensors (1014), (1016), and (1018). The sensors may detect color, temperature, viscosity, opacity, density, or may measure the concentration of some component in the fluid for example.

Figure 1B:
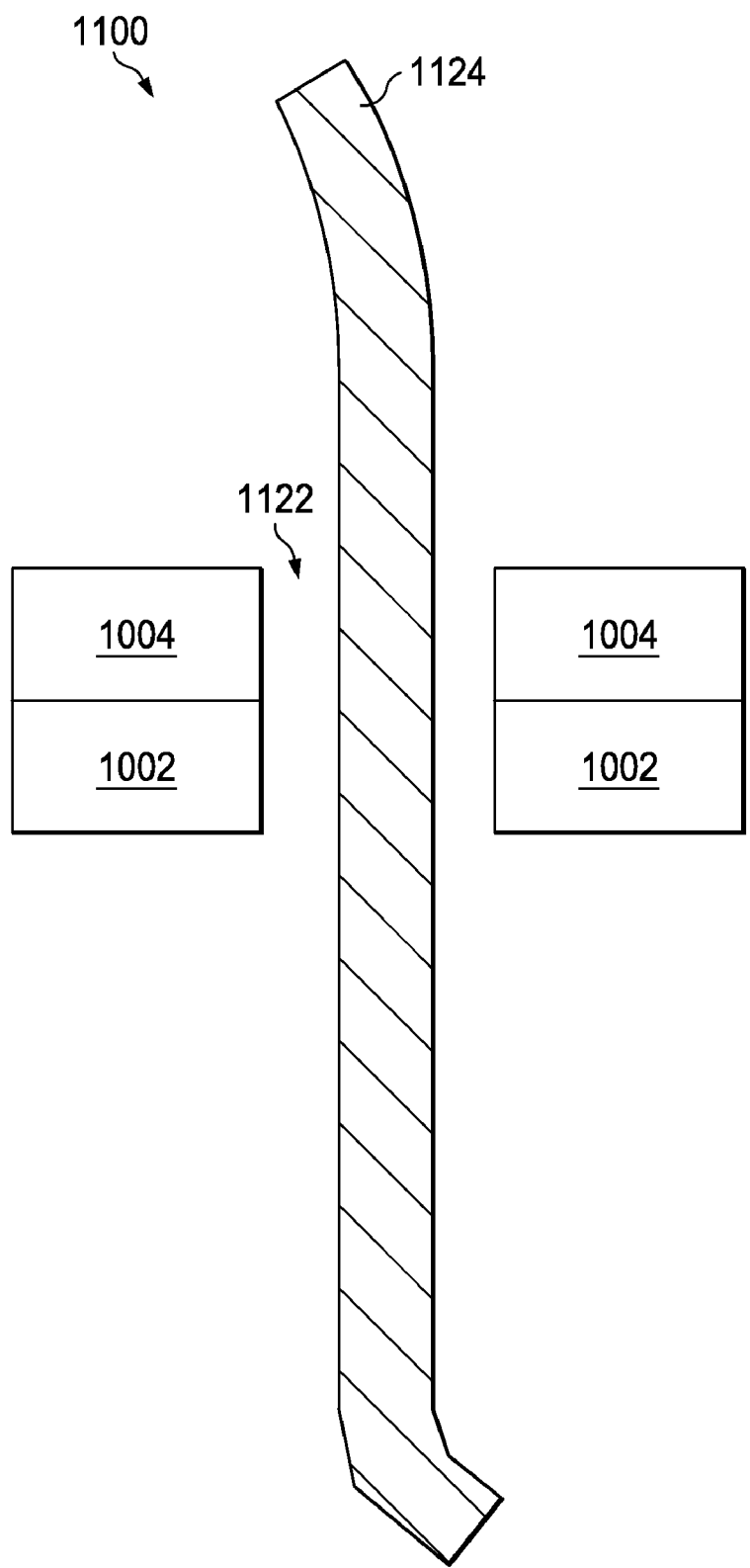

In a second example, integrated circuit (1100) with large microchannel (1122) in FIG. 1B contains a substrate (1002) upon which an integrated circuit (1004) has been fabricated. The microchannel (1122) provides a conduit through which a wire (1124) may pass to provide a signal path from the circuit (1004) or from some other chip above integrated circuit (1100) to a chip below (not shown). The microchannel (1122) in this integrated circuit (1100) is large and may have a dimension of 30 um or greater. The microchannel (1100) may instead be used as a channel through which cooling fluid may flow to remove heat from the integrated circuit (1100), for example.

A method of simultaneously forming large and small microchannels in an integrated circuit using deep reactive ion etching, DRIE, with a processing time comparable to the formation of small microchannels is illustrated in FIGS. 2A through 2L according to an embodiment. In this embodiment a trench which encloses a portion of the substrate defines the dimensions of a large microchannel. Later in the process the enclosed portion of the substrate is removed to open the large microchannel.

Figure 2A:
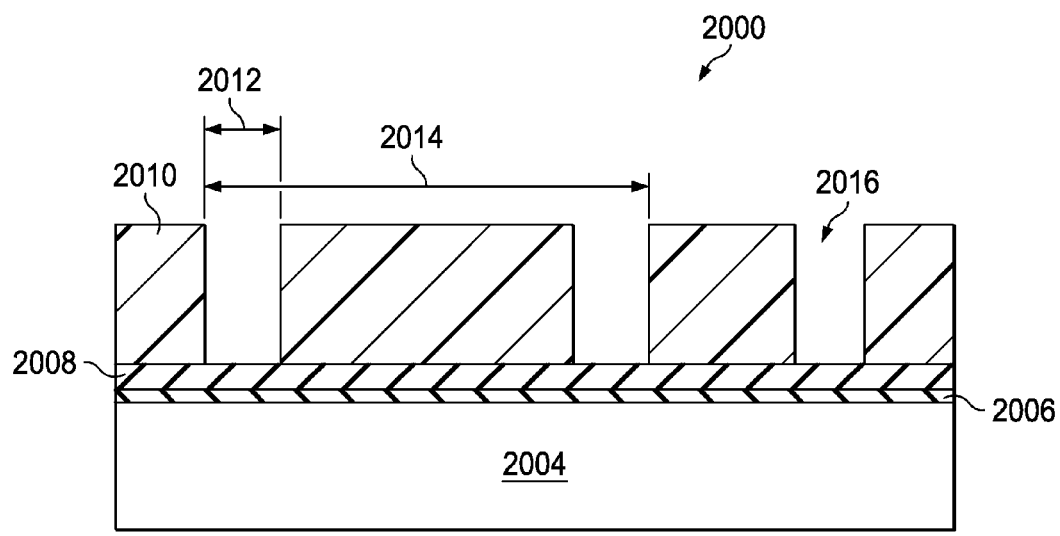
FIG. 2A through FIG. 2L are illustrations of steps in the fabrication of an integrated circuit with both large and small through substrate microchannels according to an embodiment.

FIG. 2A shows a crossectional view (2000) of a photoresist microchannel pattern (2010) formed on substrate (2004). The pattern may be the first step performed on the wafer or an oxide may be grown on the wafer prior to forming the microchannel pattern (2010). Alternatively a nitride film (2008) may be deposited on a pad oxide film (2006) prior to forming the microchannel pattern (2010) as is shown in FIG. 2A, for example.

Figure 2B:
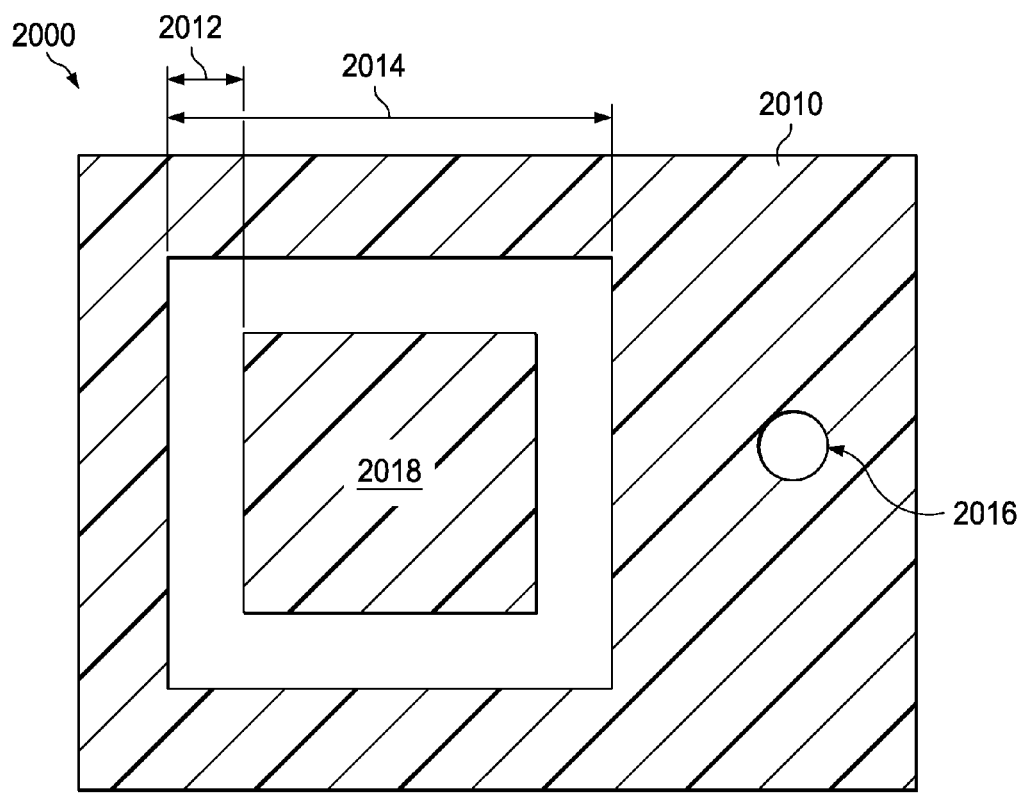

FIG. 2B is a top down view of the integrated circuit (2000) shown in FIG. 2A. Through silicon via (TSV) pattern (2010) forms a large trench (2014) TSV with a small trench width (2012) and also forms a small TSV (2016). The substrate material interior to the large trench and under the portion of the pattern (2018) is later removed to form the large TSV.

Although the microchannels in this embodiment are formed prior to isolation, the microchannels could equally well be formed after isolation. Isolation may be shallow trench isolation (STI) or LOCOS. If the microchannels are formed prior to isolation and if a first pad oxide (2006) plus a first nitride (2008) is used, the first pad oxide (2006) and nitride (2008) films may be stripped and a second pad oxide plus a second nitride may be formed prior to STI or LOCOS or the first pad oxide (2006) and nitride (2008) may be used in forming the STI or LOCOS isolation. With either option, the microchannels are formed prior to forming transistors and other devices on the substrate surface.

Both a large microchannel (2014) and a small microchannel (2016) are simultaneously being formed in this embodiment. A rectangular shape is used to illustrate the large microchannel and a circular shape for the small microchannel, but other shapes may be used as well. The width of the large trench (2012) may be on the order of 5 to 50 microns whereas the width of the large microchannel (2014) being formed using the trench may be on the order of 30 microns to 100 microns or more.

Figure 2C:
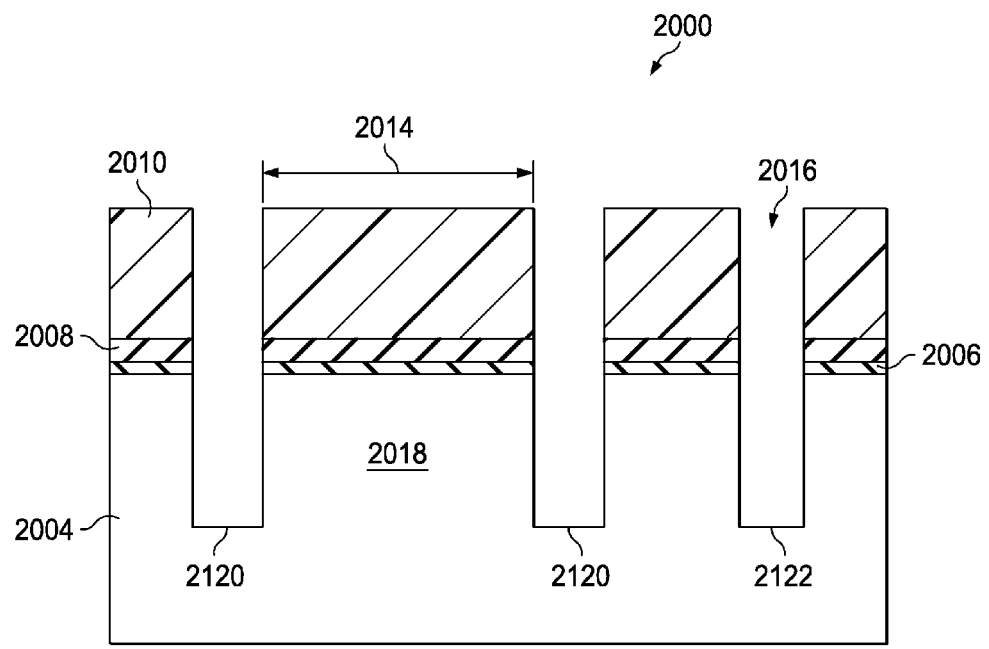

Large microchannel trench (2120) and small microchannel (2122) are etched into the substrate (2004) in FIG. 2C using an etching process such as deep reactive ion etching (DRIE). The etching time of the entire large microchannel opening (2014) including the substrate (2018) enclosed by the trench (2120) would be significantly longer than the etching time of trench (2120) due to etch loading effects. Forming large microchannels by etching a narrow rectangular trench and later removing the enclosed substrate significantly reduces the etching time and improves TSV etched depth uniformity.

Figure 2D:
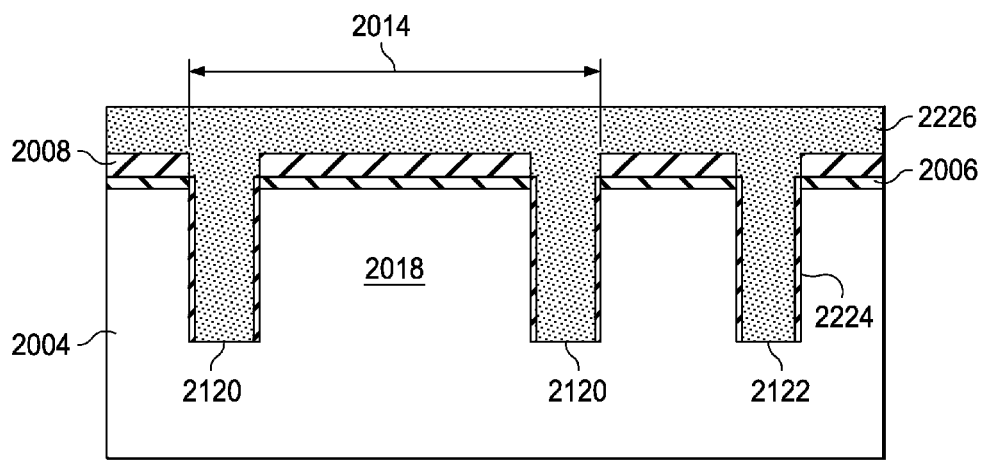

In a preferred embodiment shown in FIG. 2D, a dielectric layer (2224) such as oxide or nitride or oxynitride is deposited or grown on the walls of the large microchannel trench (2120) and the small microchannel (2122). The microchannel openings are then filled with a material (2226) such as polysilicon that withstands integrated circuit manufacturing conditions including temperatures and later may be removed without harm to the fully formed integrated circuit. Although the preferred embodiment is to line the TSV's with a dielectric and fill the TSV with polysilicon the TSV could be etched and then filled with other materials (2226) such as a spin-on-glass, HSQ or SiLK for example, without first forming a dielectric liner on the sidewalls of the TSV.

Figure 2E:
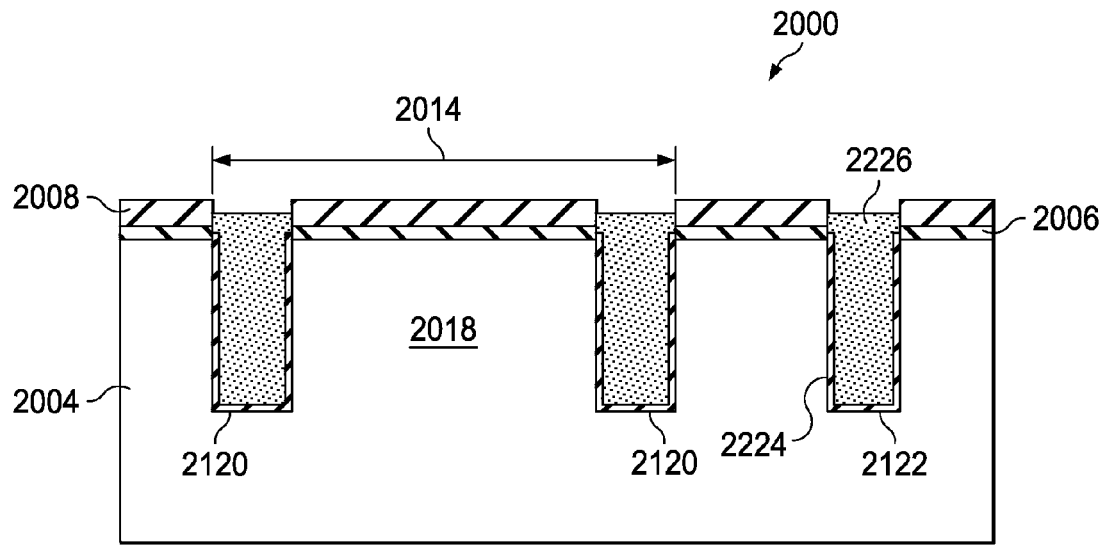

FIG. 2E shows partially processed integrated circuit (2000) after the excess fill material (2226) has been removed by a process such as etch back or CMP. CMP is the preferred method.

Figure 2F:
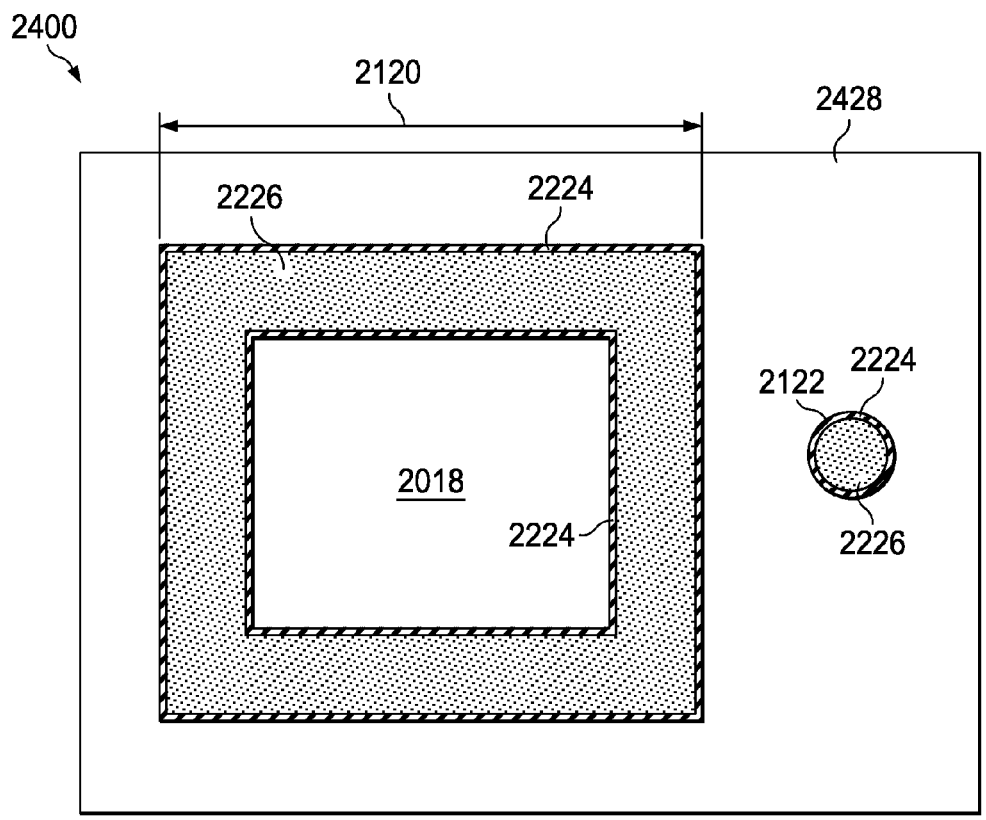
Figure 2G:
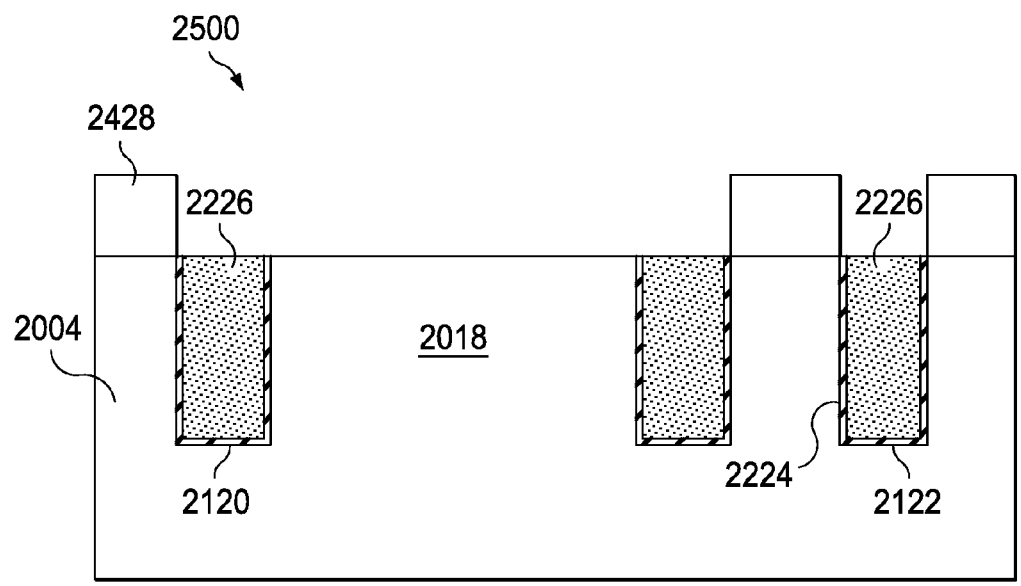

FIGS. 2F and 2G show top down (2400) and crossectional (2500) views after the integrated circuit (2000) has completed transistor and interconnect processing to build circuit structures (2428) including transistors and interconnects. Microchannels, (2120) and (2122), may be formed after the circuit structures (2428) have been formed but is not the preferred embodiment. In addition to etching the substrate, all the levels added on top of the substrate to form the integrated circuit would also have to be etched. The aspect ratio of trenches formed after the circuit structures (2428) have been constructed is significantly greater than the aspect ratio of trenches formed before the circuit structures (2428). The circuit structures (2428) have been formed outside the borders of the large microchannel (2120) and outside the small microchannel (2122). No circuit structures (2428) have been formed on the interior region (2018) of the large microchannel (2120). This interior region (2018) is later removed to form the large microchannel (2120) opening.

Figure 2H:
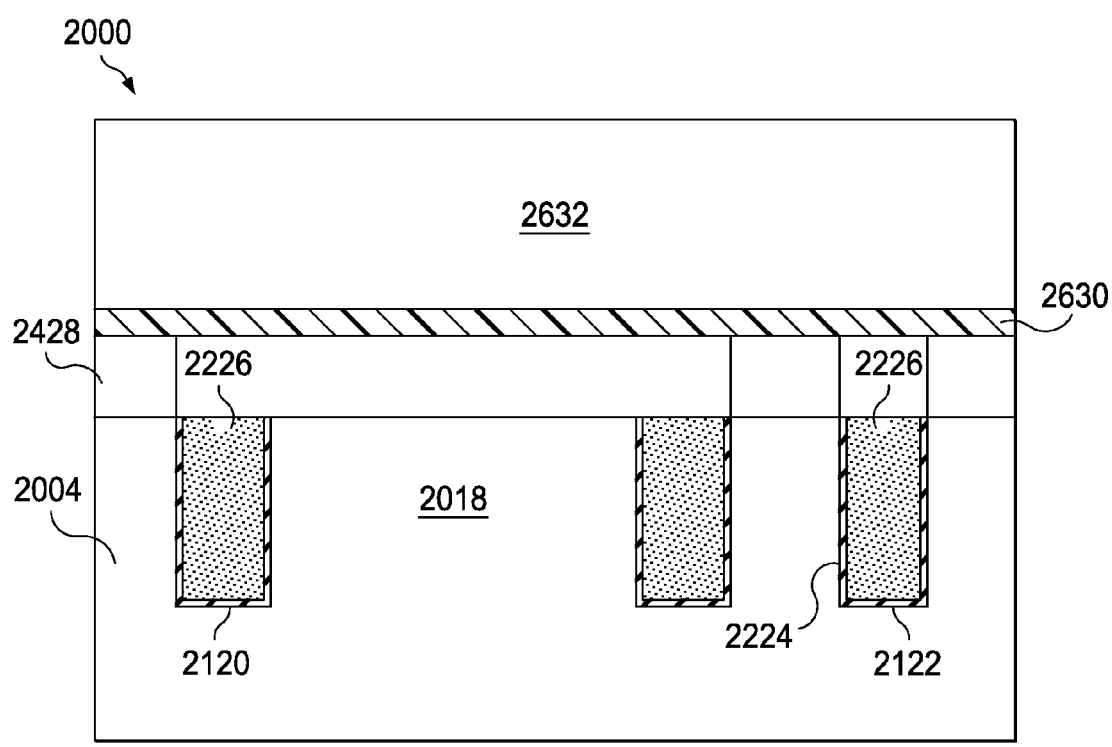

In FIG. 2H, an adhesive (2630) is used to attach a support or handler wafer (2632) to the integrated circuit (2000).

Figure 2I:
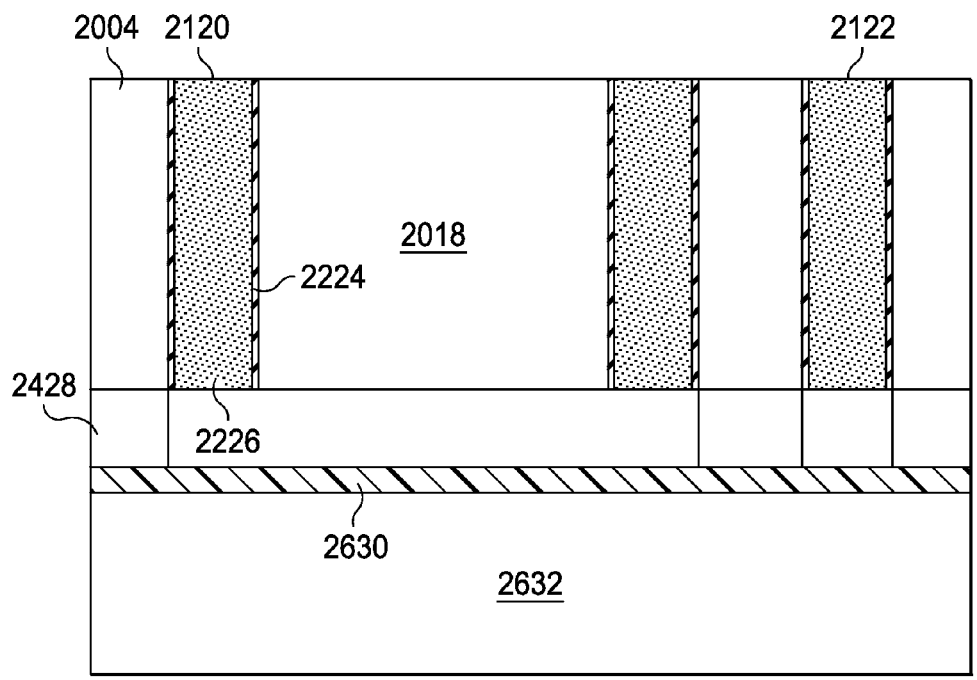

As shown in FIG. 2I, the wafer is then turned over and the substrate (2004) is thinned from backside either by grinding and polishing or by etching to expose the bottom of the large microchannel trench (2120) and the small microchannel (2122). The preferred method is to backgrind first and then to either polish or etch away the damage layer formed during backgrind.

Figure 2J:
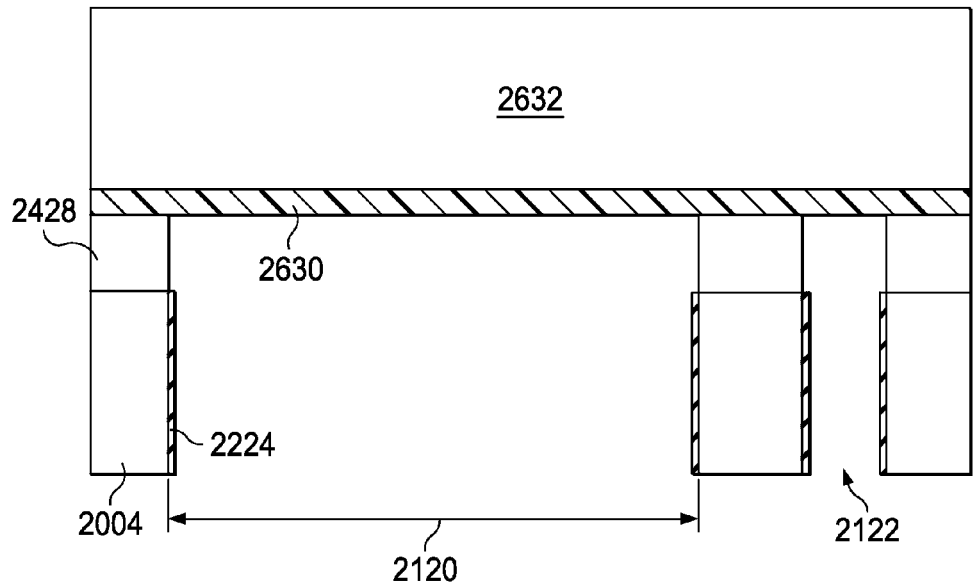

In FIG. 2J, the trench fill material (2226) is removed. Removing the trench fill material releases the interior region (2018) of the microchannel (2120) causing it to fall out. Large microchannel (2120) is fully opened as is the small microchannel (2122). This method avoids using DRIE to etch the interior region of the large microchannel which significantly reduces processing time and increases across wafer trench depth uniformity. The preferred method is to use polysilicon as the trench fill material (2226) and to use a wet etch such as tetra methyl ammonium hydroxide (TMAH) to remove the polysilicon.

Figure 2K:
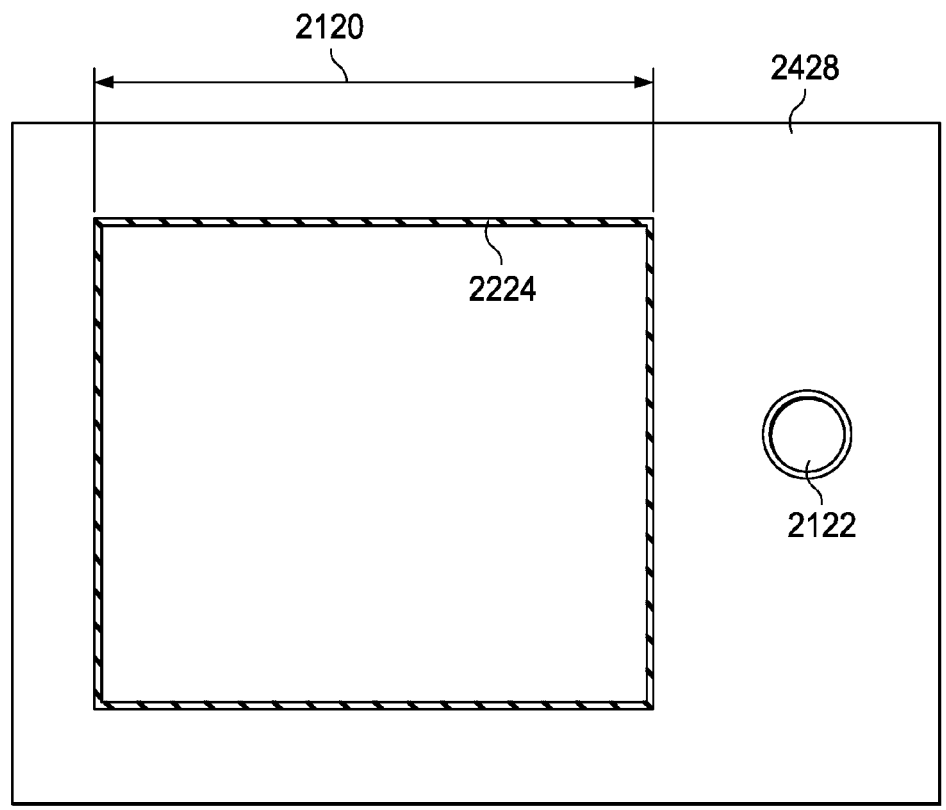

A top down view of the completed microchannels, (2120) and (2122) is shown in FIG. 2K. The circuit structures (2428) surround the microchannels. Dielectric liner (2224) coats the sidewalls of the microchannels in the preferred embodiment. If the microchannels were etched and then filled with a dielectric material such as spin-on-glass such as HSQ or MSQ or SILK, for example, then no dielectric such as (2224) would have to be formed on the microtrench sidewalls, (2120) and (2122), prior to fill and no dielectric would remain on the microtrench sidewalls after removal of the fill material (2226).

Figure 2L:
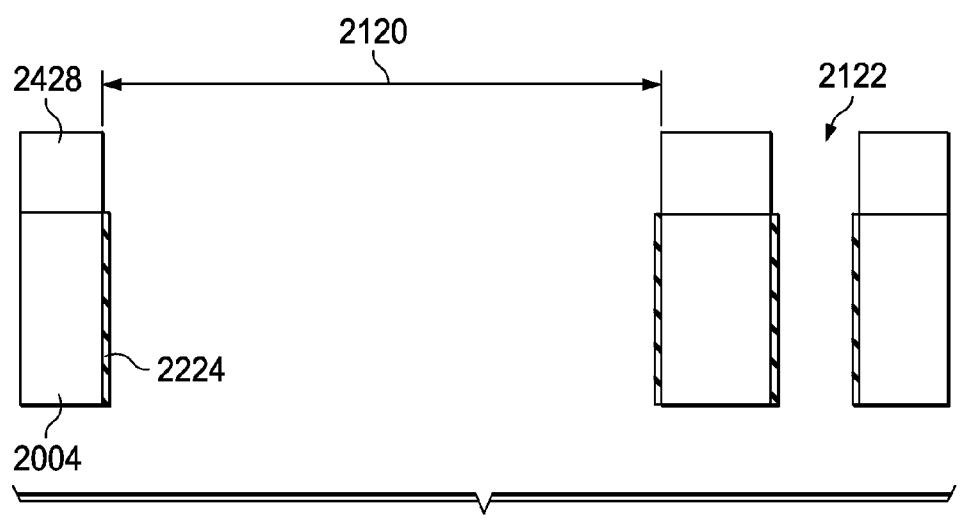

A crossection of the completed integrated circuit (2000) including the large microchannel (2120) and small microchannel (2122) is shown in FIG. 2L. Large microchannels of different sizes may be formed simultaneously by enclosing different shapes and areas of substrate with trenches of the same trench width.

A second embodiment illustrating the simultaneous formation of different sized small through substrate microchannels (3004) and (3006) is illustrated in FIGS. 3A through 3F. Small microchannels may be formed with openings in the range of 5 um to approximately 50 um.

Figure 3A:
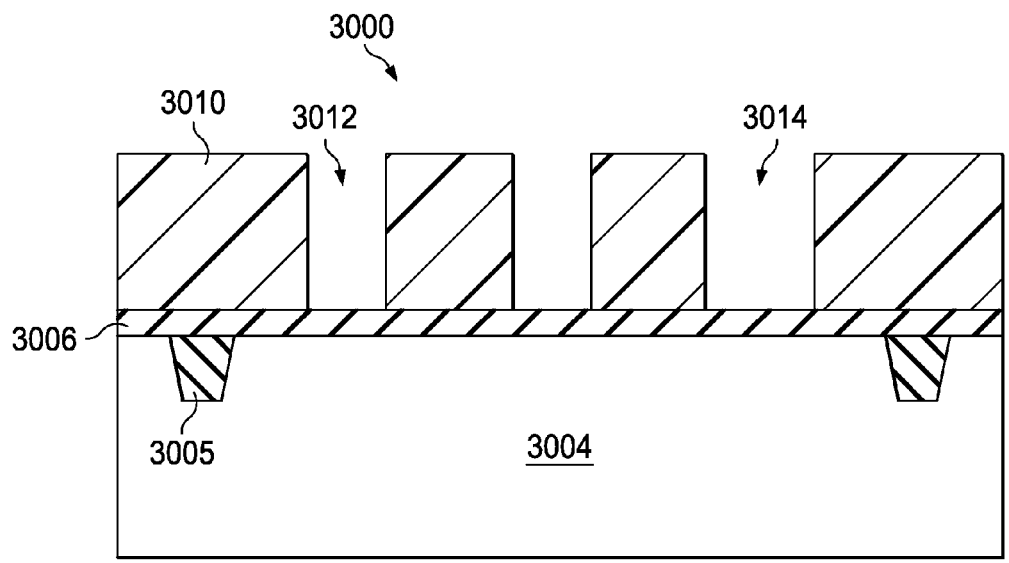
FIG. 3A through FIG. 3F are illustrations of steps in the fabrication of an integrated circuit with different sized small through substrate microchannels according to the embodiments.
Figure 3B:
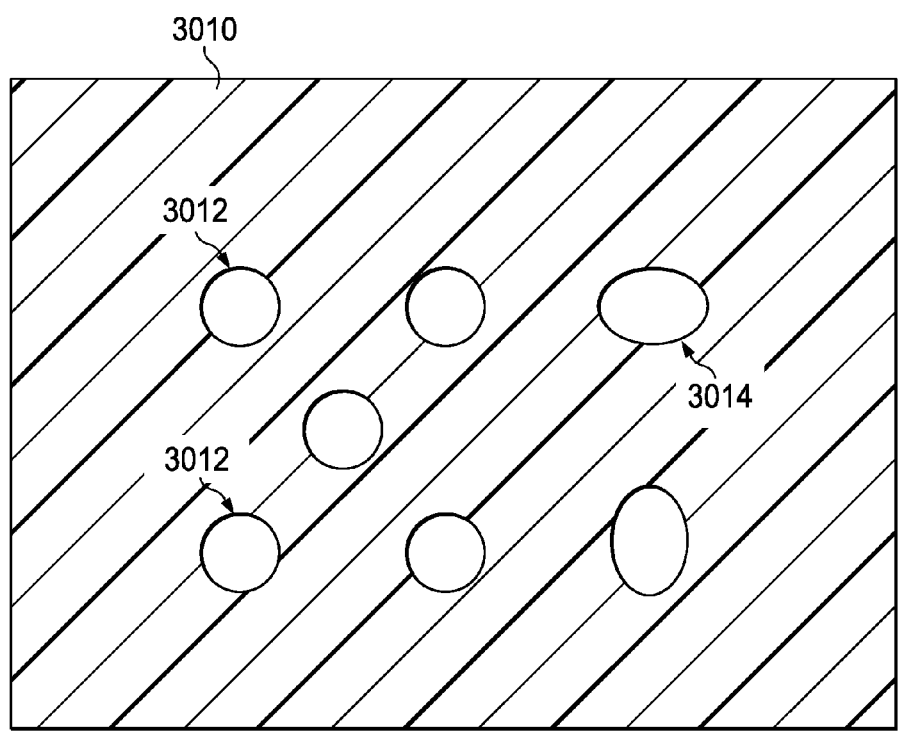

A crossectional view of the microchannel photoresist pattern (3010) with two different shape and size microchannel openings, (3012) and (3014) is shown in FIG. 3A. The microchannel photoresist pattern (3010) is formed on top of a pad oxide layer (3006) which is formed on a substrate (3004) containing shallow trench isolation (STI) (3005). As shown in FIG. 3A the micro channel photoresist pattern (3010) is formed on substrate (3004) after STI (3005) formation and after a pad oxide (3006) has been deposited or grown. The preferred method is to grow the pad oxide in a furnace to a thickness of approximately 10 nm.

This embodiment is illustrated by forming the microchannels after shallow trench isolation (STI) (3005) has been formed. The microchannels (3012) and (3014) may also be formed prior to isolation as illustrated in the previous embodiment. Locos isolation may also be used to illustrate this embodiment.

Figure 3C:
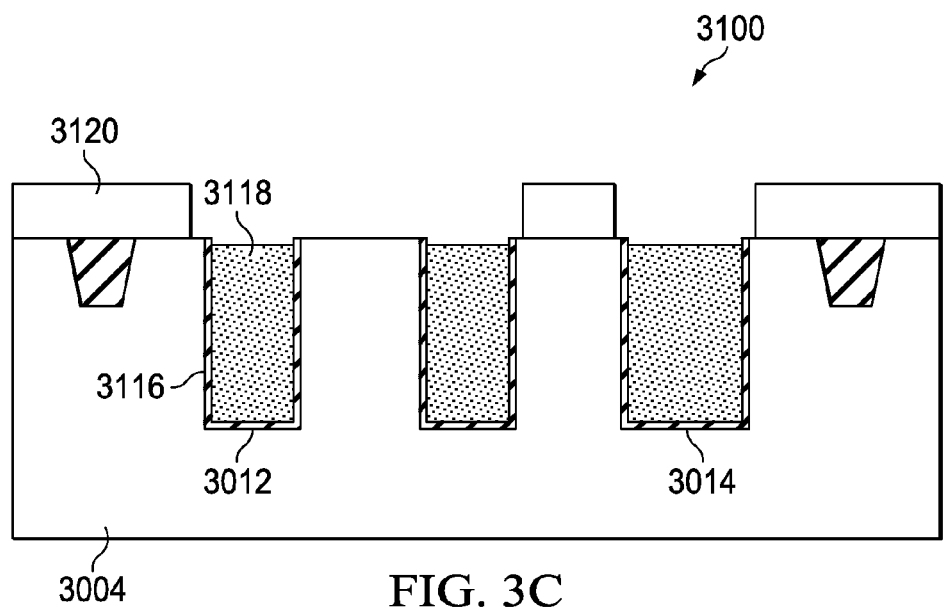

FIG. 3C shows a crossectional view (3100) of the integrated circuit after the microchannels (3012) and (3014) are etched, lined with dielectric (3116), and filled with a trench fill material (3118) such as polysilicon as described in the previous embodiment. After the polysilicon overfill is removed by etchback or CMP, an integrated circuit (3120) is constructed.

Figure 3D:
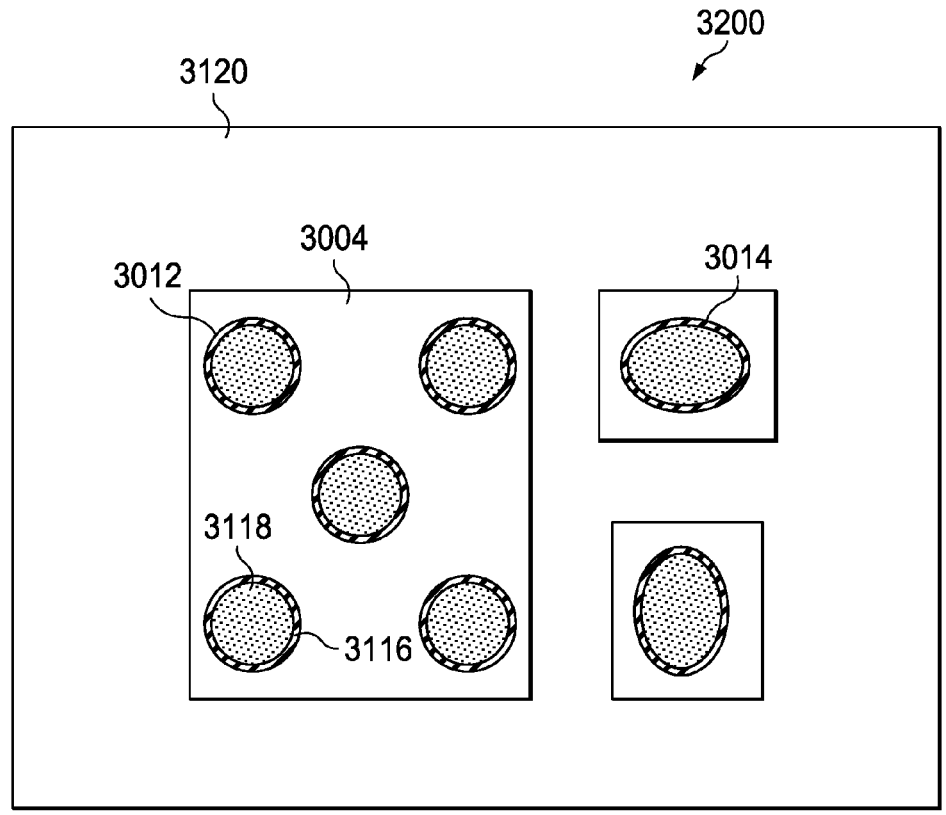

The top down view (3200) in FIG. 3D shows an exclusion zone around the microchannels (3012) and (3014) which contains no integrated circuit. If the mircochannels are to be used for fluid, the size of the exclusion zone may vary depending upon the attachment requirements of the fluid delivery system or additional channeling may be built within layers of the integrated circuit over the microchannels (3012) and (3014) during or after the integrated circuit processing. Other exclusion zone requirements may arise depending upon how the microchannels are used and what type of device is attached.

Figure 3E:
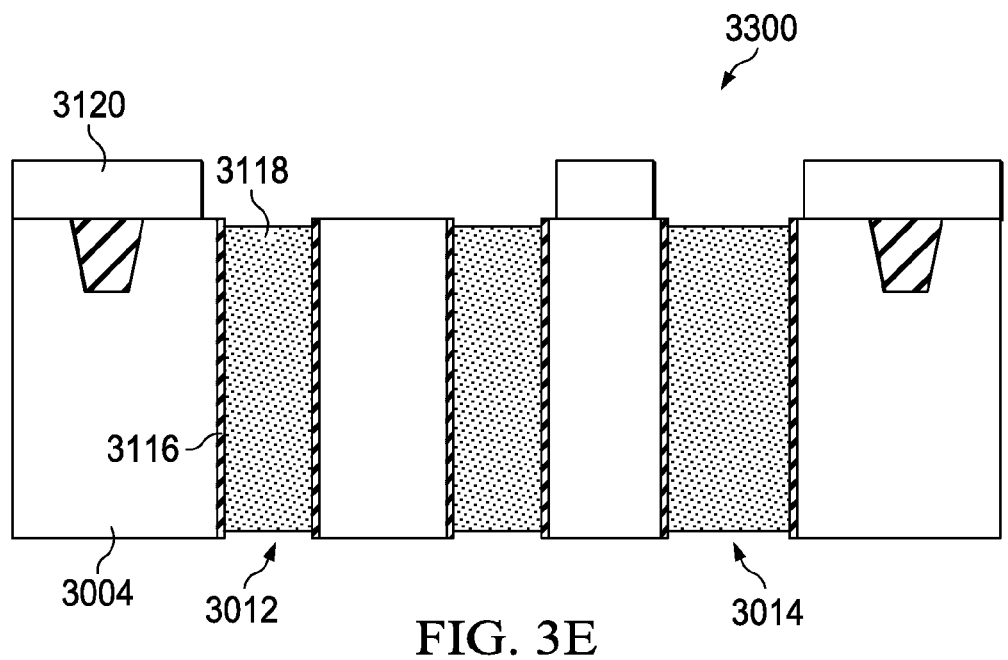

FIG. 3E shows a crossection (3300) of the integrated circuit after the backside of the wafer has been thinned to expose the bottoms of the micro channels, (3012) and (3014).

Figure 3F:
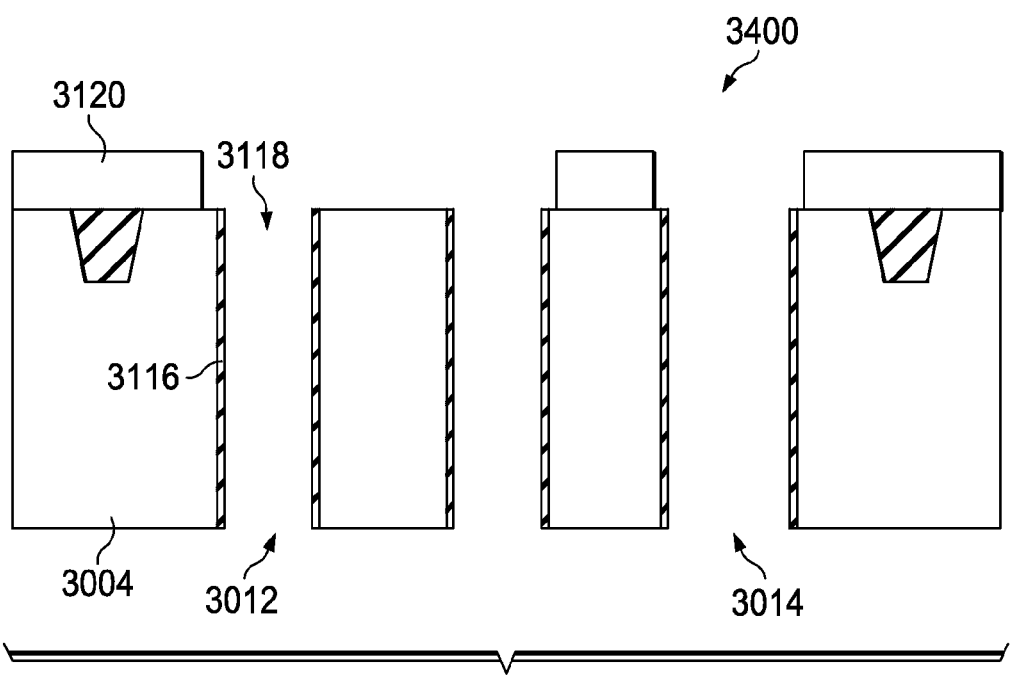

FIG. 3F shows a crossection (3400) of the integrated circuit after the trench fill material (3118) has been removed to open the microchannels (3012) and (3014).

As mentioned earlier, other sacrificial trench fill material (3118) such as a spin-on-glass (HSQ or SiLK for example) may be used instead of the preferred embodiment which is polysilicon. In this case a dielectric trenchfill material (3118) microtrench liner (3116) may be omitted.

It may be advantageous to perform additional processing on the backside of the wafer prior to removal of the microtrench fill material to facilitate interfacing between the macro and micro environments. For example, it may be beneficial to alter the backside of the wafer around the microchannels to accommodate the attachment requirements of a fluid delivery system, the attachment to another integrated circuit, or attachment to some other device.

Figure 4A:
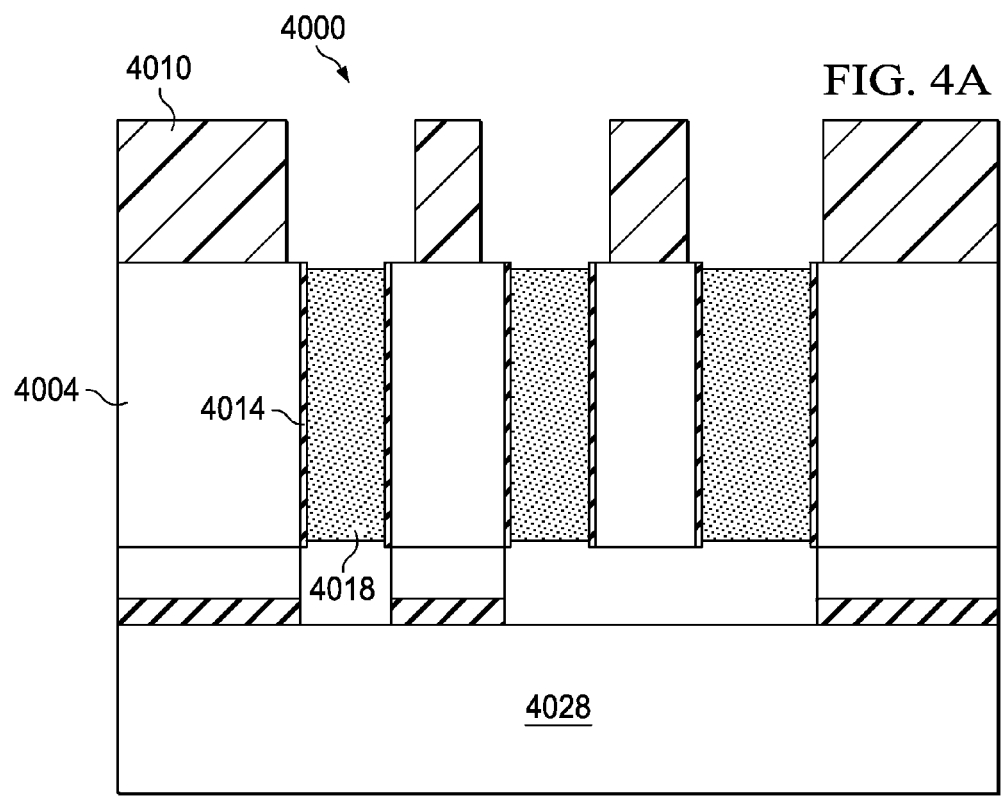
FIG. 4A through FIG. 4C are illustrations of steps in the fabrication of an integrated circuit with through substrate microchannels with tapered backside structures that mate with another device such as a coolant system for example.
Figure 4B:
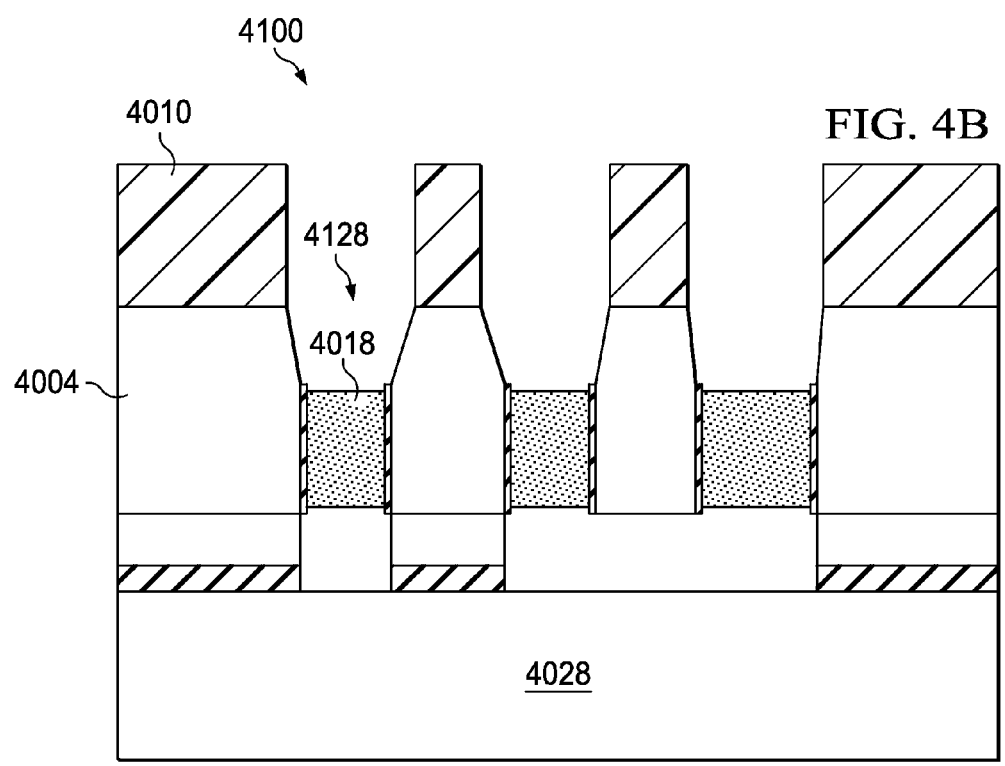
Figure 4C:
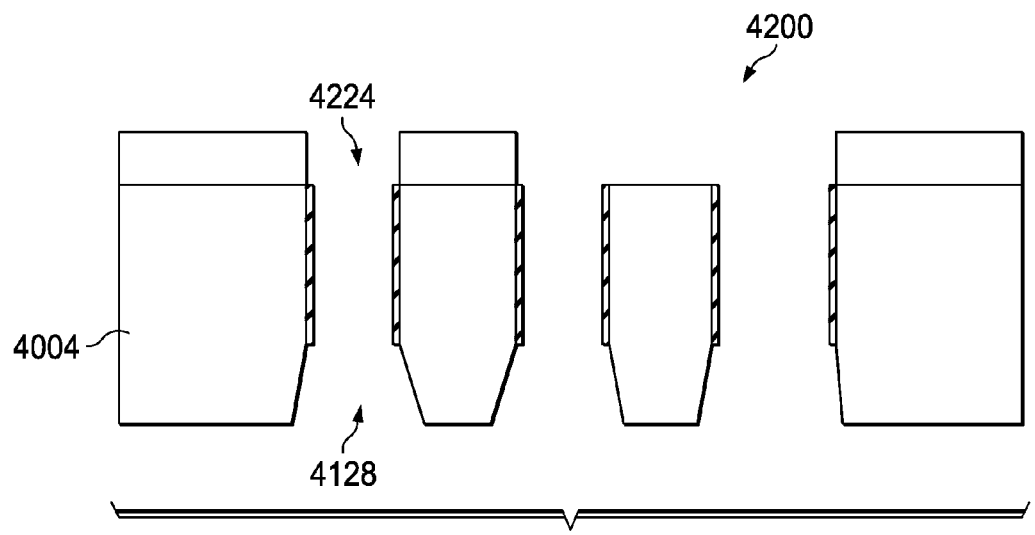

FIGS. 4A through 4C illustrate the formation of tapered openings around microchannels on the backside of the wafer.

After completing the thinning of the backside of the wafer to expose the bottoms of the microchannels as described in the previous embodiments, a pattern (4010) is formed on the backside of the wafer. The wafer is still attached to the handler wafer (4028). A tapered etch is then used to form the tapered portion of the microchannel shown (4128) shown in FIG. 4B. The etch may be performed using a plasma etch that etches silicon (4004), dielectric (4014) and polysilicon (4018) at substantially the same rate. The etch may also be performed using a wet tapered etch for the silicon (4004) and polysilicon (4018) followed by a dielectric (4014) wet or dry etch. A plasma etch with an approximately 1:1 etch selectivity of silicon and dielectric is the preferred embodiment.

After the tapered etch and pattern removal, the polysilicon (4018) is removed and the handler wafer (4028) is removed. The completed integrated circuit (4200) with tapered backside openings (4128) to microchannels (4224) is shown in FIG. 4C.

Figure 5A:
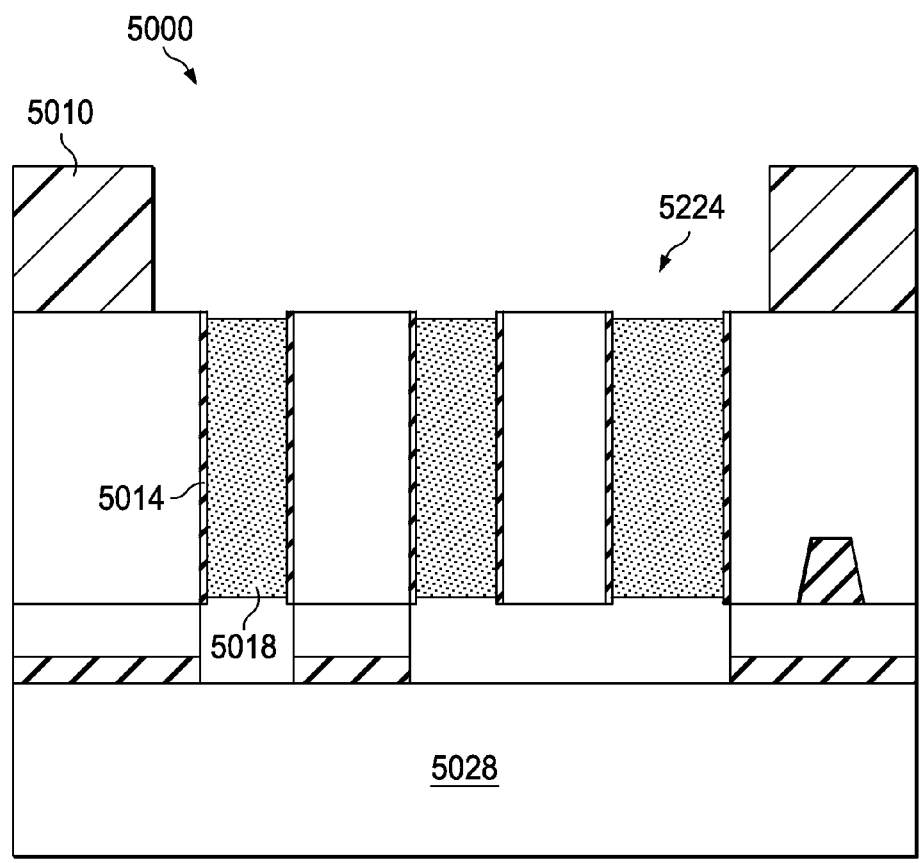
FIG. 5A through FIG. 5C are illustrations of steps in the fabrication of an integrated circuit with through substrate microchannels with backside structures that mate with another device such as a coolant system for example.
Figure 5B:
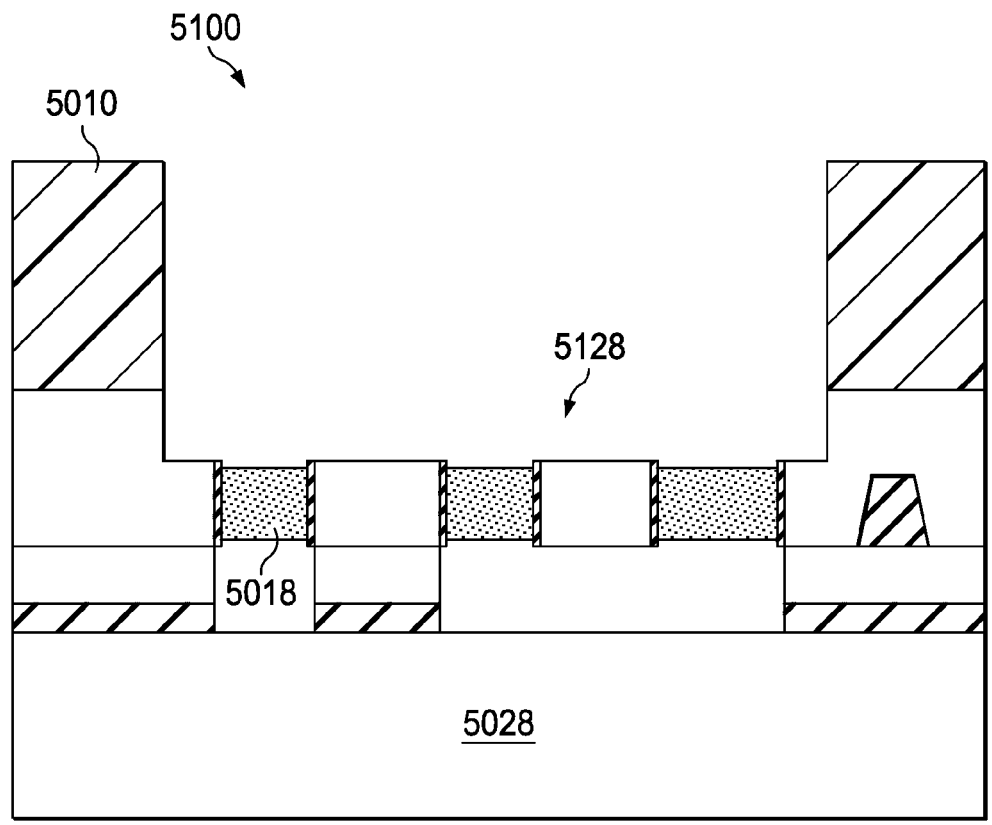
Figure 5C:
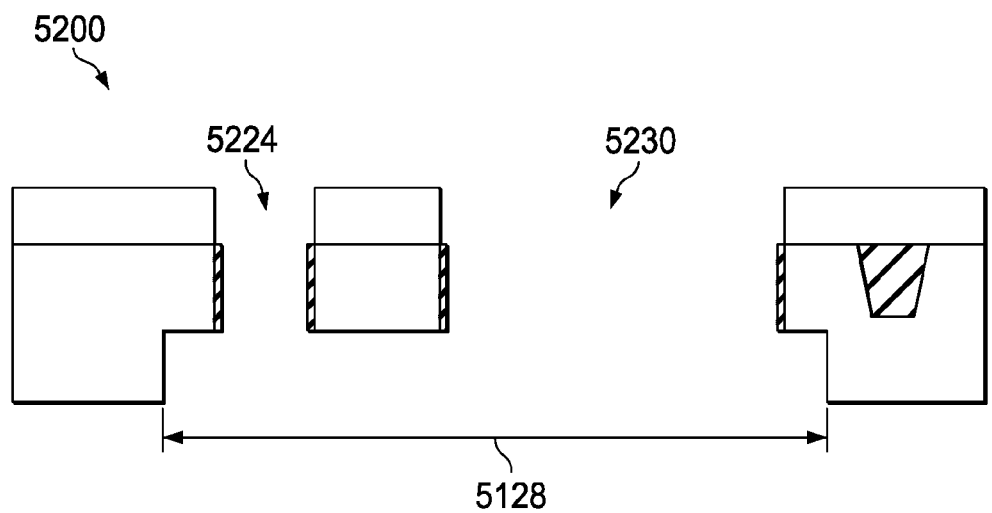

FIGS. 5A through 5C present another example of backside processing to form a structure to accommodate attachment to a fluid delivery system or attachment to some other device.

In FIG. 5A, a pattern (5010) is formed on the backside of the wafer after the backside has been thinned to expose the bottom of the microchannels (5024).

The silicon is then etched to form a structure (5128) as shown in FIG. 5B. A plasma etch or a wet etch may be used to etch the substrate as described previously. A plasma etch with approximately a 1:1 selectivity to silicon and the dielectric is the preferred embodiment so that the dielectric (5014) is also removed.

As shown in FIG. 5C, the polysilicon (5018) is then removed and the handler wafer (5028) is removed to form the completed integrated circuit (5200). Both a small microchannel (5024) and a large microchannel (5230) are formed simultaneously in this example embodiment.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit with a large microchannel, comprising;
   forming microchannel patterns in photoresist on a substrate wherein at least one of said microchannel patterns is a trench pattern that encloses a portion of said substrate;
   etching trenches into said substrate;
   thinning a backside of said substrate to expose the bottoms of said trenches;
   removing said portion of said substrate to form said large microchannel;
   prior to thinning said backside, filling said trench with a trench fill material;
   removing overfill of said trench fill material; and,
   after said thinning of said backside removing said trench fill material from said trench.

2. The method of claim 1 wherein said integrated circuit is fabricated prior to forming said microchannel pattern and wherein said trenches etched through the layers which form said integrated circuit before the trench is etched into said substrate.

3. The method of claim 1 wherein said integrated circuit is fabricated after said microchannels have been formed.

4. A method of forming an integrated circuit with a large microchannel, comprising:
- forming at least two microchannel patterns on a substrate of said integrated circuit prior to formation of circuit structures wherein at least one of said at least two microchannel patterns is a trench pattern that encloses a portion of said substrate;
- etching trenches into said substrate;
- filling said trenches with a trench fill material capable of withstanding processing conditions used to form said circuit structures;
- removing overfill of said trench fill material;
- forming said circuit structures on said substrate containing said trenches;
- thinning backside of said substrate to expose the bottom of said trenches;
- removing said material from said trenches; and,
- removing said portion of said substrate.

5. The method of claim 4 further comprising:
- forming a dielectric liner on the sidewalls of said trench prior to filling said trench with said trench fill material.

6. The method of claim 5 wherein said dielectric layer is at least one of an oxide, a nitride and an oxynitride and wherein said trench fill material is polysilicon.

7. The method of claim 4 wherein at least one dimension of said enclosed portion of said substrate is greater than 20 microns.

8. The method of claim 4 wherein a depth of said trench is in the range of 15 to 50 microns and wherein a width of said trench is in the range of 5 to 50 microns.

9. The method of claim 4 wherein said microchannel patterns are all the same dimension.

10. The method of claim 4 wherein said microchannel patterns have a plurality of dimensions.

11. The method of claim 4 further comprising forming an isolation before forming said microchannel trenches wherein said isolation is at least one of STI and LOCOS.

12. The method of claim 4 further comprising forming an isolation after forming said microchannel trenches wherein said isolation is at least one of STI and LOCOS.

* * * * *